United States Patent [19]
Whitmire

[11] Patent Number: 6,140,927
[45] Date of Patent: Oct. 31, 2000

[54] BATTERY FAILURE INDICATOR FOR A SINGLE BATTERY

[75] Inventor: Warren Taylor Whitmire, Shalimar, Fla.

[73] Assignee: Batcon, Inc., Fort Walton Beach, Fla.

[21] Appl. No.: 09/179,282

[22] Filed: Oct. 26, 1998

Related U.S. Application Data

[63] Continuation-in-part of application No. 08/758,843, Dec. 2, 1996, abandoned.

[51] Int. Cl.⁷ .................................................... G08B 21/00
[52] U.S. Cl. .......................... 340/636; 340/635; 324/433; 324/434; 320/126; 320/116; 320/112; 320/FOR 106; 320/FOR 115; 320/FOR 147; 320/DIG. 13; 320/DIG. 18; 320/DIG. 21
[58] Field of Search ..................................... 340/636, 635; 324/433, 434; 320/126, 116, 112, 113, FOR 106, FOR 107, FOR 115, FOR 16, FOR 147, FOR 148, DIG. 13, DIG. 18, DIG. 21

[56] References Cited

U.S. PATENT DOCUMENTS

| | | | |
|---|---|---|---|
| 3,818,325 | 6/1974 | Boshers | 324/433 |
| 4,424,491 | 1/1984 | Bobbett et al. | 324/433 |
| 5,027,294 | 6/1991 | Fakruddin et al. | 364/550 |
| 5,302,902 | 4/1994 | Groehl | 324/434 |
| 5,675,234 | 10/1997 | Greene | 320/15 |
| 5,751,217 | 5/1998 | Kchao et al. | 340/636 |
| 5,825,155 | 10/1998 | Ito et al. | 320/16 |

*Primary Examiner*—Julie Lieu

[57] ABSTRACT

A modification to existing mono-block battery design for positively indicating the operating condition of the battery. The voltage of two groups of internal series connected cells are measured and compared. An indicator of one color indicates the battery is operating normally, an indicator of a contrasting color indicates the battery is defective.

1 Claim, 7 Drawing Sheets

BATTERY FAILURE INDICATOR FOR A SINGLE BATTERY

CROSS-REFERENCE TO RELATED APPLICATIONS

This is a continuation-in-part of U.S. patent application Ser. No. 08/758,843 filed Dec. 2, 1996, now abandoned.

BACKGROUND OF THE INVENTION

The present invention relates to determining the condition of a single battery or a battery in multi-battery power pack in which the batteries are connected in either series or parallel.

U.S. Pat. No. 4,823,086 to Whitmire et al., discloses a battery monitoring and condition indicator for a multi-battery pack in which the batteries are connected in series. The system monitors the condition of each battery in a series multi-battery pack to determine if any battery in the battery pack is faulty.

U.S. Pat. No. 5,175,531 to Whitmire et al., discloses a battery monitoring and condition indicator for a multi-battery pack in which the batteries are connected in parallel. The system monitors the condition of each battery in a multi-battery pack to determine if any battery in a parallel battery pack are faulty.

Numerous patents and designs exist in the industry that operate similar to the designs disclosed in the patents referred to above. All of these designs require multiple wire connections to the batteries (or cells) being monitored or measured. An enclosure device is also required for the measurement circuits and indicating elements.

The present invention is an improvement on all of the previous designs because it eliminates external connections, an additional enclosure is not required and, one design or embodiment of the invention is applicable for all configurations of batteries such as a single battery, series connected strings of batteries, parallel connected strings of batteries, parallel connections of series strings, or series connections of parallel strings.

Batteries connected in parallel are the more difficult application because current sensors and amplifiers are required for determining faulty batteries in addition to the measuring and comparison circuitry. The simpler methods of measuring the potential difference between the positive and negative terminals of each battery can not be used to indicate the condition of a single battery within the battery pack. Since the voltage of the battery in best condition will be indicated when the potential difference of each battery in the battery pack is measured, methods that measure the current of each battery must be used. These methods are less preferable due the additional attendant current sensors and amplifiers.

It is therefore the principal object of the present invention to provide an improved modification to a standard battery for indicating the operating condition of an individual battery.

A further object of the present invention is to provide an improved means for determining the condition of an individual battery in a series or parallel multi-battery pack, or variations of series and parallel connections.

In addition, an object of the present invention is to provide a means to eliminate the need to monitor the battery current to indicate the status of a battery in a parallel multi-battery pack.

PRIOR ART

A variety of methods exist is the prior art for detecting defective cells or batteries connected in series or parallel. The method used is specific to each configuration. A difference in cell voltage is used for series connected batteries or cells, this can not be used for parallel connected batteries but, the voltage difference method can be used for detecting failures in a series string of cells even when multiple strings are connected in parallel. The present invention utilizes the internal series string of cells present in most batteries. It is required that connections be made to the internal inter cell connecting straps for detecting cell failures and determining the operating condition of the battery.

SUMMARY OF THE INVENTION

According to the present invention, a monitoring system is provided which can detect the operating condition of a single battery, or an individual battery in a series or parallel battery pack, then positively indicate the operating condition of said battery.

The failure indicator is proximate to the exterior of the battery case with a plurality of visual indicators of contrasting color. The monitoring system is electrically connected to internal inter-cell conductors at a minimum of three connection points such that the voltage of each multiple group of internal series connected cells within the battery can be measured.

The present invention is incorporated into the battery case by the battery manufacturer. The features of the present invention will be more fully understood from the following detailed description that should be read in light of the accompanying drawings.

DETAILED DESCRIPTION OF THE PREFERRED EMBODIMENTS

Figure 1:
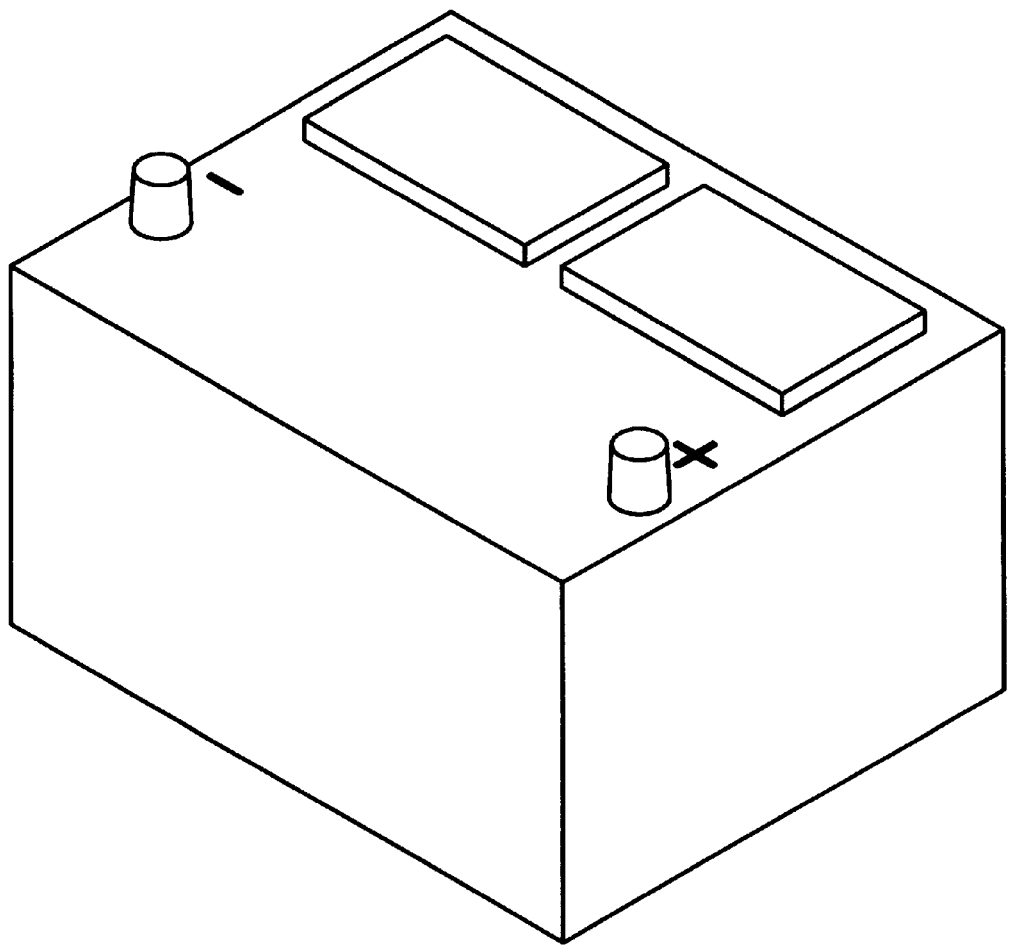
FIG. 1 is a typical sealed mono-bloc 12V lead acid battery.
Figure 2:
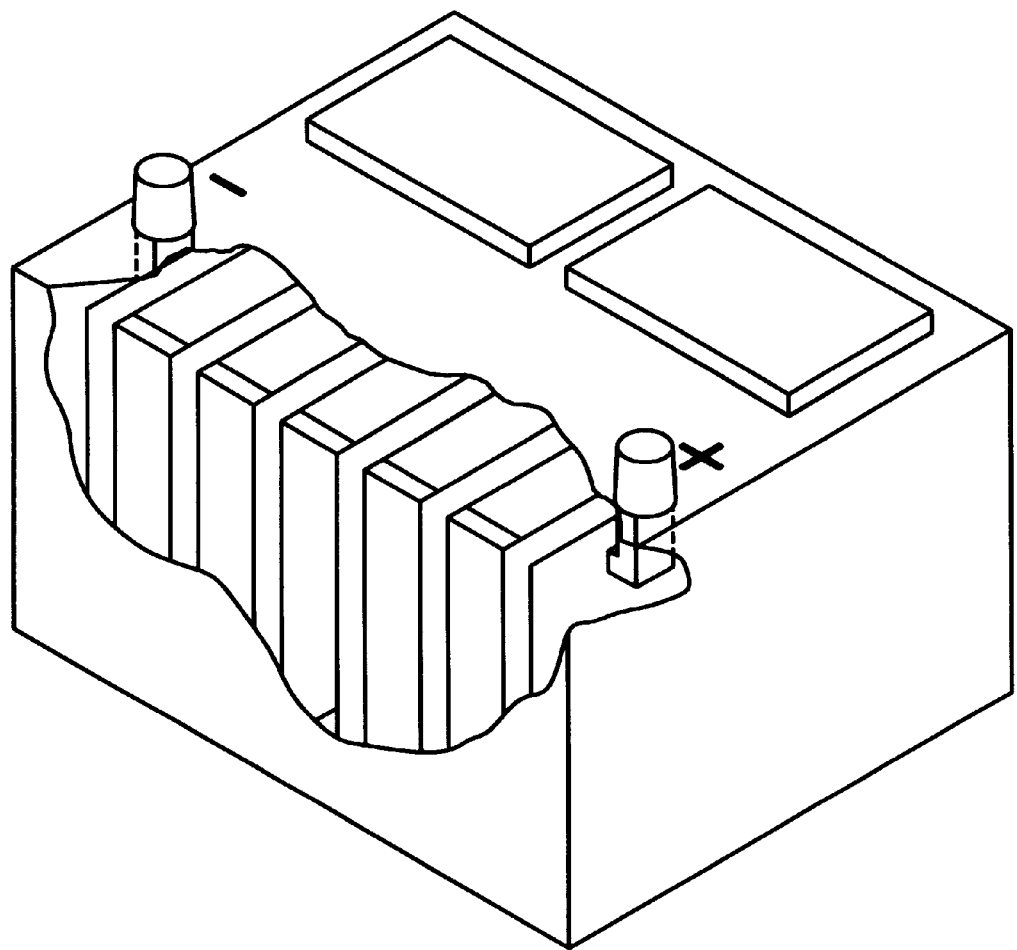
FIG. 2 is a typical sealed mono-bloc 12V lead acid battery with the exterior case cut away to show internal construction.

The present invention will be described with reference to a single twelve volt battery. The battery is constructed of six individual cells. Referring to FIG. 2, the internal view of an unmodified 12V battery is shown with the cells and connecting straps exposed.

Figure 3:
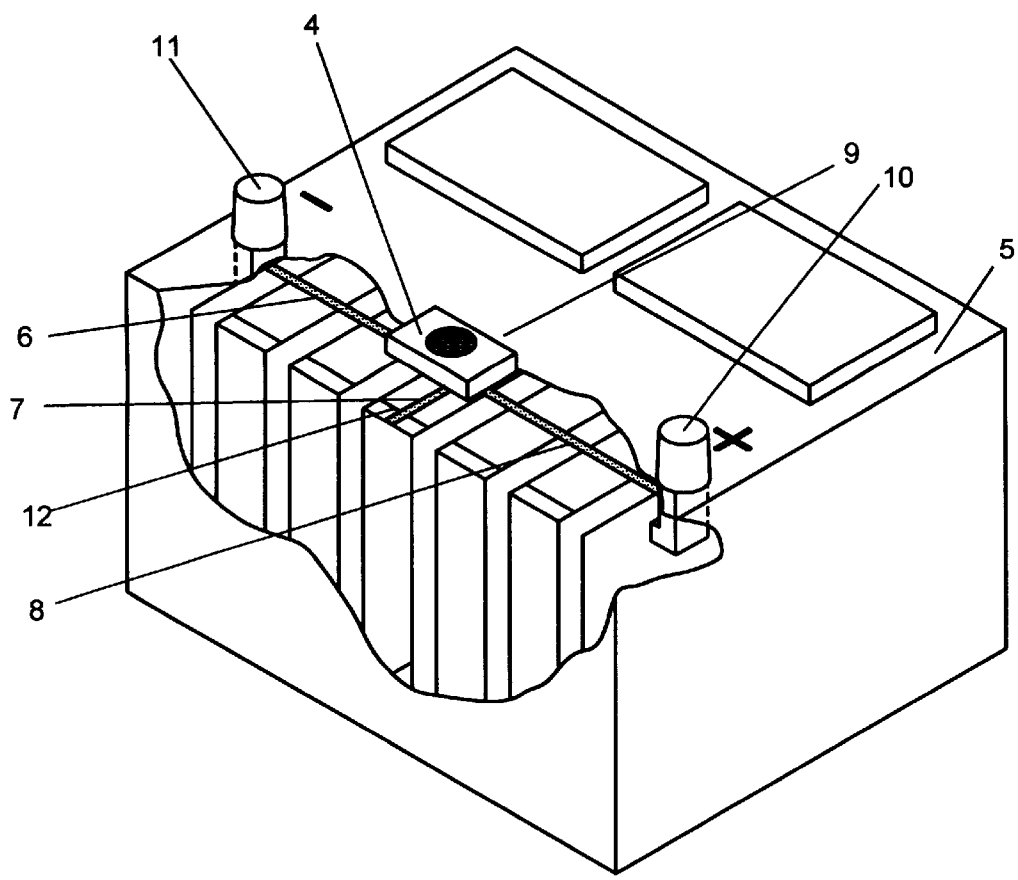
FIG. 3 is a typical 12V lead acid battery modified with the preferred embodiment of the present invention. The cell plates, inter-cell connections, and wire connections to three points within the battery are shown.

The mechanical attachment of the failure detector 4 in the preferred embodiment of the present invention will be described by referring to FIG. 3. The bottom face of the failure detector 4 is proximate to the top exterior wall 5 of the battery case. At least three electrical wires 6, 7, 8 from the detector 4 pass through a hole 9 in the top wall of the battery case for attachment to the interior elements of the battery. The first wire 8 is electrically attached to the positive post 10 of the battery on the interior of the battery. The second wire 7 is electrically attached to the center inter cell connection strap 12. In a 12V battery this would be the electrical connection between the positive side of third cell and the negative side of the fourth cell. The third wire 6 is electrically attached to the negative post 11 of the battery.

Figure 4:
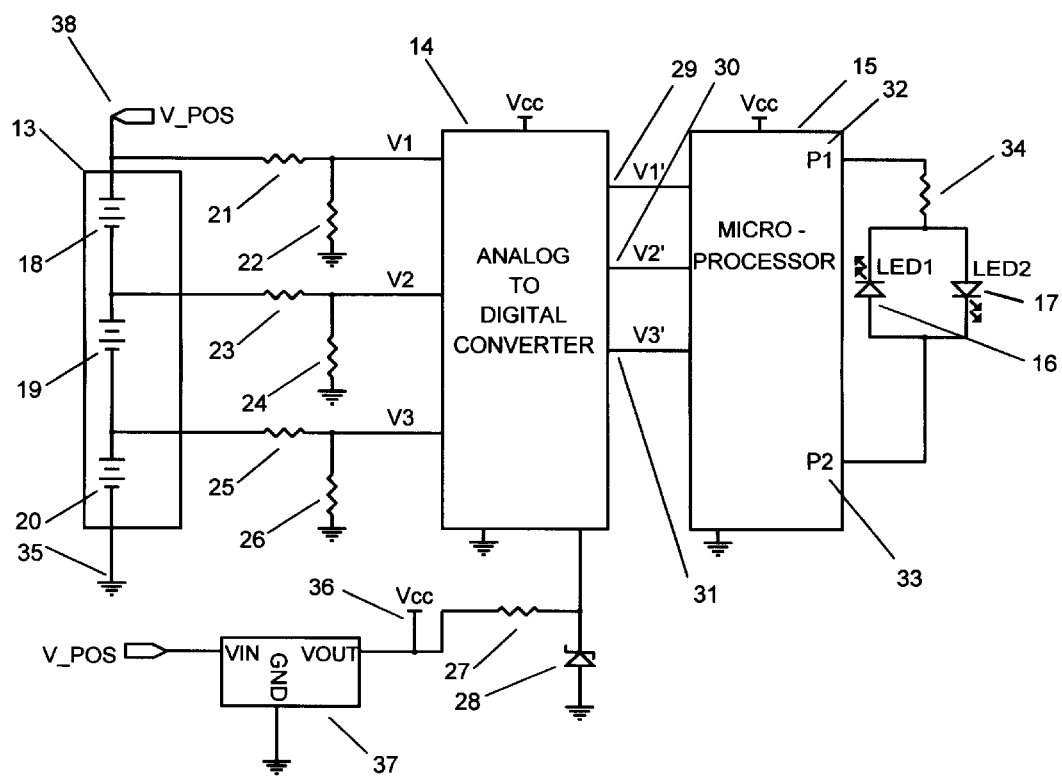
FIG. 4 is a schematic diagram of a multi-cell battery, comprised of three cell groups, modified with the preferred embodiment of the present invention.

FIG. 4 is a first schematic diagram of the electrical circuit elements for measuring the internal cell voltages, making comparisons and indicating the battery condition. The battery 13 is composed of three groups of cells 18, 19, 20. A resistor network is connected to each cell group to scale the voltage potential of the cell group to a level compatible with the analog to digital converter 14. The analog to digital converter 14 (referred to as A/D) measures the scaled voltage across resistors 22 as V1, resistor, 24 as V2, and 26 as V3 with respect to ground 35, V1, V2, V3 which represent the voltage potentials for cell groups 18, 19, and 20, respectively. The A/D is a type that is well known in the art. Many A/Ds are available with input multiplexer, serial or parallel interfaces for communicating with other digital devices or microprocessors, and voltage references. A wide selection of A/Ds with the above functions are available as monolithic integrated circuits (ICs). The microprocessor and A/D communicate status, control, and data by interface ports. The use of the interface ports is known to those skilled in the art.

The digital representation of V1, V2, V3 are presented to the microprocessor as V1'29, V1'30 and V3'31 respectively. The program in the microprocessor executes the functions described next.

V2' is subtracted from V1' resulting in Vcell1,
V3' is subtracted from V2' resulting in Vcell2,
V3" is equal to Vcell3.
A constant, dV is stored in the microprocessor,
The sum of (Vcell1+dV) is subtracted from Vcell2 resulting in VD1,
The sum of (Vcell1+dV) is subtracted from Vcell3 resulting in VD2,
The sum of (Vcell2+dV) is subtracted from Vcell1 resulting in VD3,
The sum of (Vcell2+dV) is subtracted from Vcell3 resulting in VD4,
The sum of (Vcell3+dV) is subtracted from Vcell1 resulting in VD5,
The sum of (Vcell3+dV) is subtracted from Vcell2 resulting in VD6,
If the values in VD1 ... VD6 are less than 0 then LED2 17 is illuminated which indicates all cells are operating appropriately, else, LED1 16 is illuminated which indicates a defective cell has been detected. LED1 16 is illuminated by setting output port P1 32 on the microprocessor to a low value (near 0 volts) and simultaneously setting microprocessor port output port P2 33 to a high value (near Vcc). Current will flow from P2 33 through Led1 16 and resistor 34 causing LED1 16 to illuminate. LED2 17 is illuminated by setting output port P1 32 on the microprocessor to a high value (near Vcc) and simultaneously setting microprocessor port P2 33 to a low value (near 0 volts). Current will flow from output port P1 32 through Led2 17 and resistor 34 causing LED2 17 to illuminate. LED1 and LED2 are shown as separate elements but are also available as a single combination device.

Additional components in FIG. 4 are required for complete disclosure. The most negative terminal of the battery is connected to circuit ground 35. The most positive terminal of the battery 38 is connected to the input side of the power supply 37. The construction of the power supply is known to those skilled in the art. The output of the power supply 37 designated as Vcc 36 provides operating power to the active components such as the A/D converter 14, the microprocessor 15 and the voltage reference which includes resistor 27, diode 28. The reference is a simple reference diode used in zener mode. The construction of a reference is known to one in the art. The reference often may be part of the A/D.

Figure 5:
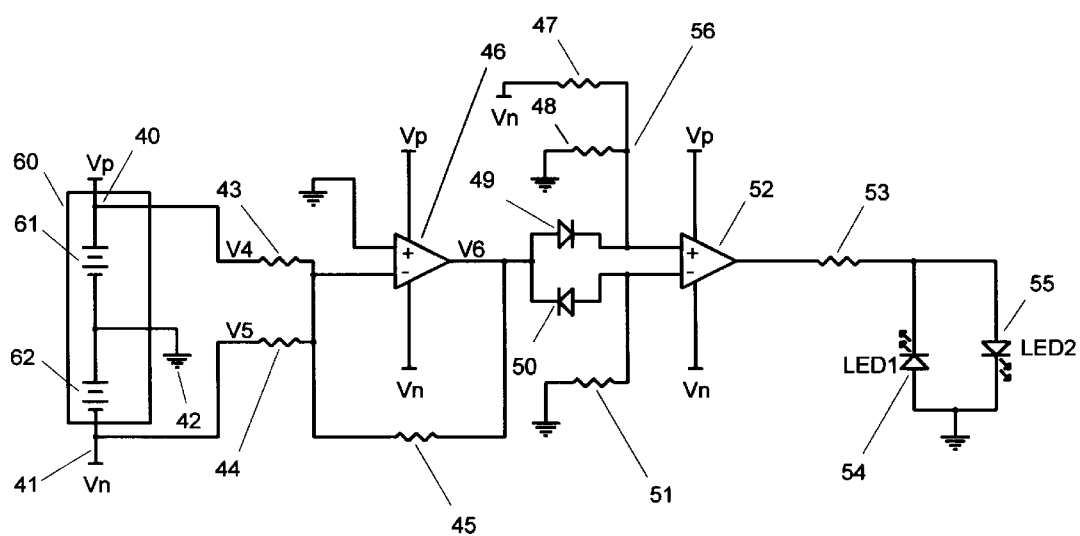
FIG. 5 is a schematic diagram of a multi-cell battery with 2 groups of cells modified with the second embodiment of the present invention.

Referring to FIG. 5, a second schematic diagram of the preferred embodiment of the present invention. FIG. 5 shows a hardware implementation which may be less expensive in some applications. The battery 60 is composed of two groups of cells in series 61, 62. The voltage potential from 40 to 42 of the first cell group, V4 and the voltage potential from 41 to 42 of the second cell group, V5 are algebraically summed by the amplifier consisting of 43, 44, 45, and 46. The algebraic sum of V4 and V5 is V6. The operation and design of the summing amplifier is known to those in the art. The output of the summing amplifier, V6, is applied to the window detector consisting of 47, 48, 49, 50, 51, and 52. The operation and design of a window detector are known to one in the art. The reference voltage 56 is sensed by resistors 47, 48. V6 is steered to the positive input of amplifier 52 by diode 49 or to the negative input of amplifier 52 by diode 50. When magnitude V6 is more than the voltage drop across diode 49 or diode 50 the output of amplifier 52 driven positive, which causes current to flow through resistor 53 and LED2 55 illuminating LED2 55 which indicates that a defective cell has been detected. When magnitude V3 is less than the voltage drop across diode 49 or diode 50 the output of amplifier 52 driven negative, which causes current to flow through resistor 53 and LED1 54 illuminating LED1 54 which indicates that a defective cell has been detected.

The gain of each input in the summing amplifier shown in FIG. 5 is equal when a battery with an even number of cells is used since the number of cells in each group is the same, hence, the nominal voltage of each cell group is the same. A battery with an odd number of cells can be accommodated by proportionately increasing the gain of the summing amplifier input connected to proportionately lower cell group voltage.

A variation of the circuit shown in FIG. 5 would be to replace LED1 54 and LED 55 with a single BI-Color LED2. The amplifiers 46 and 49 are common monolithic operational amplifiers known to those is the art. Amplifier 52 could also be a monolithic comparator.

Figure 6:
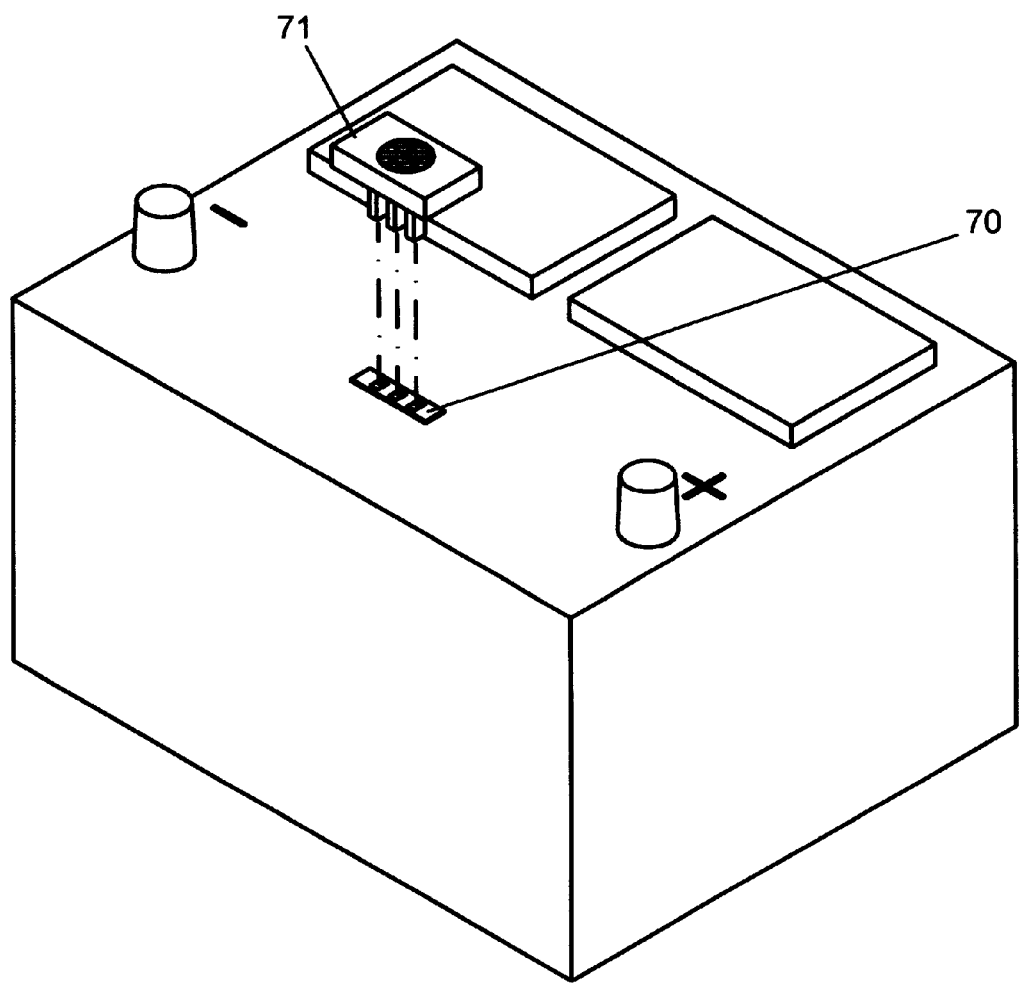
FIG. 6 is an exterior view of a conventional twelve volt battery modified with the connector embodiment of the present invention.

While previous discussions have been based on the present invention permanently connected to internal conductors within the battery, other variations are possible. The internal connections to the battery could be terminated in a connector. The first part of the connector is attached to the battery case and the second part of the connector is attached to detecting circuits. The third embodiment of a modified twelve volt battery is shown in FIGS. 6 and 7.

The first part of the connector 70 is shown attached to the exterior battery case, the second connector is attached to the detector circuit 71.

Figure 7:
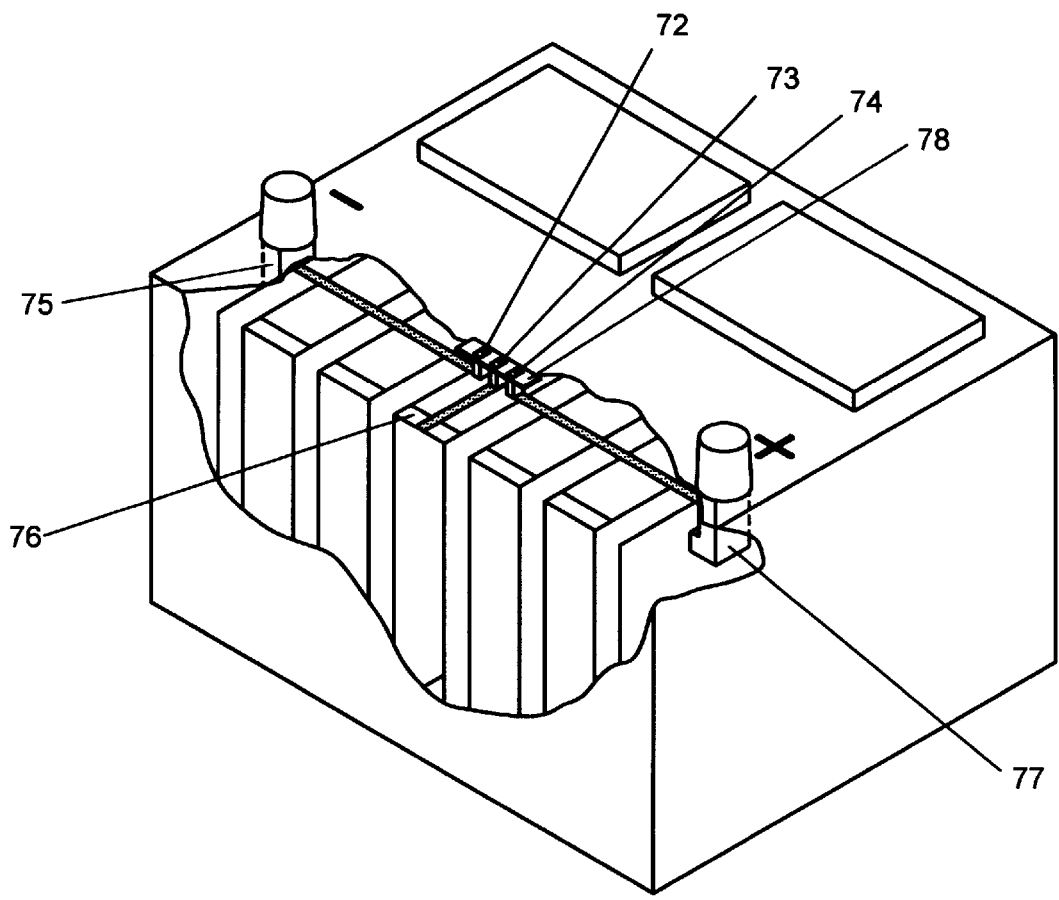
FIG. 7 is a typical 12V lead acid battery modified with the connector embodiment of the present invention. The wire connections to the three points within the battery are shown.

Referring to FIG. 7, a first Connector contact 72 is electrically attached to the internal conductor 75 connecting the positive post of the battery to the positive plate of the sixth cell (12V nominal). A second connector contact 73 is electrically attached to the internal conductor 76 positive plate of the third cell (6V nominal) and the negative plate of the fourth cell (8V nominal). A third connector contact 74 is electrically attached to the internal conductor 77 connecting the negative post of the battery to the negative plate of the first cell (2V nominal). The three pin connector 78 is embedded in the case of battery.

While the foregoing invention has been described with reference to its preferred embodiments, various modifications and alterations will occur to those skilled in the art. For example, while the system of the present invention has been described with reference to a twelve volt battery, the invention can be adapted to any battery with any number of cells. In addition by having additional connections to each cell, each individual cell can be measured and then compared to determine if it is weak or faulty.

The entire device will be embedded into the case of the battery during manufacturing. The embedded device may then be used as an easy and inexpensive way to determine the condition of a battery.

What is claimed is:

1. A system for monitoring the condition of a single electrical battery and providing warning of possible battery failure, said system comprising:

means for penetrating the exterior enclosure of said battery so as to connect electrical wires to the internal battery electrical conductors, means for connecting a plurality of said internal battery conductors to said monitoring system, means for detecting the difference in the magnitude of the voltage of a first group of cells in said battery and a second group of cells in said battery, said voltage difference detecting means comprising a multiplicity of voltage dividers, each of said voltage dividers connected between at least one cell of said electrical battery and one input of a multiple input analog to digital converter; a microprocessor; a power conditioning system; and an operating program, said microprocessor containing means for communication with said digital to analog converter, said operating program containing instructions executed in said microprocessor, and said instructions containing algorithms for commanding said analog to digital converter to detect voltage potential to every other said voltage potential and determine if the result of said comparisons is less than zero, whereby the condition of said single electrical battery is monitored and a warning of possible battery failure is provided;

means responsive to said detecting means for indicating the condition of said battery, said battery condition indicating means always indicating a first color when battery condition is at an acceptable working potential, and a second color when battery condition is at an unacceptable working potential, said battery condition indicating means being active with either said first color or said second color displayed.

* * * * *